(12) United States Patent
Tzeng et al.

(10) Patent No.: US 6,911,867 B2
(45) Date of Patent: Jun. 28, 2005

(54) ERROR AMPLIFIER AND DC-DC CONVERTER AND THE METHOD THEREOF

(75) Inventors: Guang-Nan Tzeng, Hsinchu (TW); Tien Tzu Chen, Taipei (TW); Yung-Chih Chen, Pingtung (TW)

(73) Assignee: Aimtron Technology Corp., Hsinchu (TW)

( * ) Notice: Subject to any disclaimer, the term of this patent is extended or adjusted under 35 U.S.C. 154(b) by 57 days.

(21) Appl. No.: 10/639,315

(22) Filed: Aug. 12, 2003

(65) Prior Publication Data

US 2004/0160270 A1 Aug. 19, 2004

(30) Foreign Application Priority Data

Feb. 18, 2003 (TW) ........................................ 92103355 A

(51) Int. Cl.[7] .............................. H03F 3/04; H03F 3/45
(52) U.S. Cl. ...................................... 330/297; 330/252
(58) Field of Search ............................. 330/10, 207 A, 330/251, 297, 252; 363/49

(56) References Cited

U.S. PATENT DOCUMENTS

| 4,598,351 A | 7/1986 | Fair et al. ...................... 363/49 |
| 6,147,477 A | 11/2000 | Saeki et al. ................. 323/273 |
| 2004/0022078 A1 * | 2/2004 | Shieh .......................... 363/49 |

FOREIGN PATENT DOCUMENTS

TW          503609         9/1989

* cited by examiner

*Primary Examiner*—Steven J. Mottola
(74) *Attorney, Agent, or Firm*—Seyfarth Shaw LLP

(57) ABSTRACT

The DC-DC converter of the present invention sets the soft start function in the error amplifier. With soft start added, the error amplifier's output voltage will follow the slowly ascending soft start voltage when the DC-DC converter is enabled. Then the soft start looses control over the error amplifier when the soft start voltage exceeds the steady state value of the error amplifier's output voltage. And meanwhile, the amplifier's input will take over the control. By doing so, the present invention significantly eradicates or reduces jitters caused by the output voltage of the error amplifier and the DC-DC converter.

4 Claims, 7 Drawing Sheets

ERROR AMPLIFIER AND DC-DC CONVERTER AND THE METHOD THEREOF

BACKGROUND OF THE INVENTION (A) Field of the Invention

The present invention relates to an error amplifier and a DC-DC converter and the converting method thereof, particularly to those involving the reduction of jitters by soft start.

(B) Description of the Prior Art

DC-DC converters have been widely applied to the development and design of electronic products. For a portable product, the output voltage of the battery declines when the battery is being discharged. Thus, it is necessary to build a DC-DC converter in the portable product for stabilizing the output voltage to a fixed value. In addition, a DC-DC converter is needed to provide various operating voltages as required by general electronic devices.

As shown in FIG. 1, a conventional DC-DC converter 10 comprises an error amplifier 11, a PWM comparator 12 and a driver 13. The output voltage ($V_{err}$) of the error amplifier 11 comes from the following equation: $V_{err}$=amplification ($A_v$)×[reference voltage ($V_{ref}$)–input voltage (IN or $n \times V_{out}$)]. To prevent the output buffer from producing excessive instantaneous current in start-up, the DC-DC converter 10 will add a slowly ascending waveform to the input of the PWM comparator 12 as a soft start signal. This arrangement will enhance a gradual increase in the output pulse width of the PWM comparator 12, and thereby reduces the instantaneous current from the output-stage transistor and protects the output-stage transistor.

FIGS. 2(a) to 2(c) show an operational timing diagram of the conventional DC-DC converter 10. In FIG. 2(a), a curve 22 represents the input oscillation curve (OSC) of the PWM comparator 12, a curve 21 represents the slowly ascending waveform in soft start, and another curve 23 represents the output of the error amplifier 11. In FIG. 2(b), the output pulse width of the PWM comparator 12 will show a gradually increasing tendency. In FIG. 2(c), both the output curve ($V_{out}$) 24 of the DC-DC converter 10 and the input curve ($n \times V_{out}$) 25 after feedback will ascend gradually so as to reduce instantaneous current.

The disadvantage of the conventional DC-DC converter 10 is that the soft start cannot control the output waveform of the error amplifier 11. Consequently, a jitter occurs since the error amplifier 11 produces a greater transient voltage before returning to the steady state voltage. Such a jitter will not only cause problems during the operation of many electronic devices but also affect the products' reliability.

Therefore, how to reduce or erase jitters in output voltage is extremely crucial since DC-DC converters have become a necessary part of many electronic devices nowadays.

SUMMARY OF THE INVENTION

The objective of the present invention is to provide an error amplifier, a DC-DC converter and the converting method thereof, so as to reduce jitters in start-up and assure the proper operation and reliability of electronic devices.

In order to achieve the objective, the DC-DC converter of the present invention sets the soft start function in the error amplifier. With soft start added, the error amplifier's output voltage will follow the slowly ascending soft start voltage when the DC-DC converter is enabled. Then the soft start looses control over the error amplifier when the soft start voltage exceeds the steady state value of the error amplifier's output voltage. And meanwhile, the amplifier's input will take over the control. By doing so, the present invention significantly eradicates or reduces jitters caused by the output voltage of the error amplifier and the DC-DC converter.

The error amplifier of the present invention comprises a soft start signal, an output signal, an input signal, a reference voltage, a clamp stage, and an error amplification module. The soft start signal has a feature of gradual ascension in start-up. The output signal will be converged to a steady state voltage and produces the input signal through feedback. When the soft start signal is smaller than the steady state voltage, the clamp stage clamps the output signal to the soft start signal. When the soft start signal is larger than the steady state voltage, the error amplification module is used to amplify the difference between the reference voltage and the input signal.

The DC-DC converter of the present invention comprises an error amplifier, a PWM comparator, and a driver. One input of the PWM comparator is connected to the error amplifier while the other input is connected to an OSC. The driver is connected to the PWM comparator for driving the external electronic components of the DC-DC converter.

The DC-DC converting method of the present invention comprises Steps (a) to (c). In Step (a), a soft start signal and a reference voltage connected to the error amplifier are provided. The soft start signal ascends gradually when the error amplifier is enabled. In addition, the error amplifier's output will be converged to a steady state voltage. In Step (b), when the soft start signal is smaller than the steady state voltage, the error amplifier output will be clamped to the soft start signal. In Step (c), when the soft start signal is larger than the steady state voltage, the error amplifier will amplify the difference between the reference voltage and the error amplifier's input signal.

BRIEF DESCRIPTION OF THE DRAWINGS

The present invention will be described according to the appended drawings in which.

DETAILED DESCRIPTION OF THE INVENTION

Figure 1:
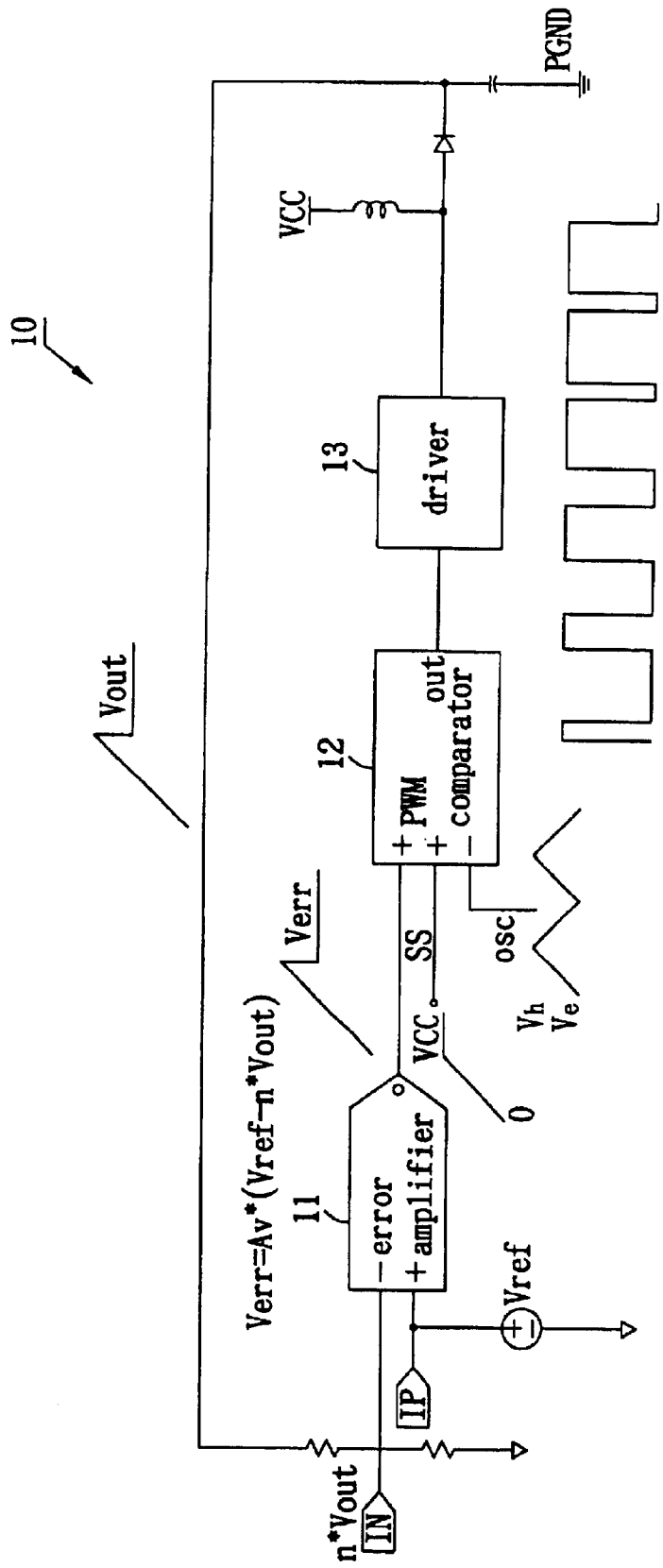
FIG. 1 illustrates a conventional DC-DC converter.
Figure 2A:
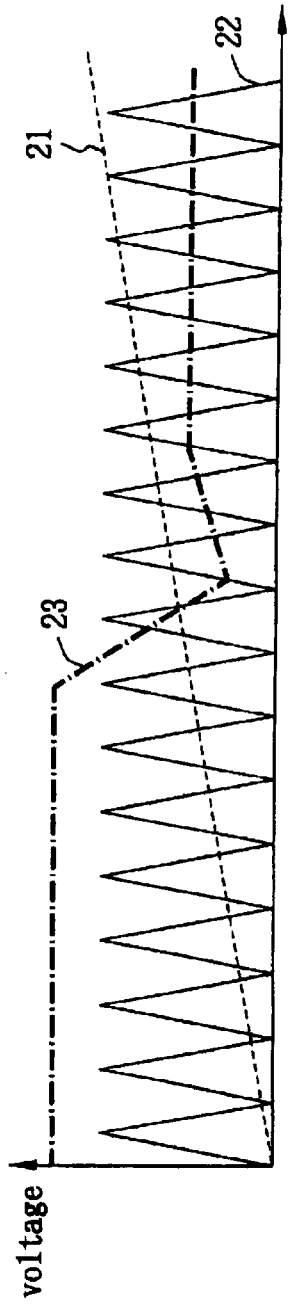
FIGS. 2(a) to (c) illustrate timing diagrams of a conventional DC-DC converter.
Figure 2B:
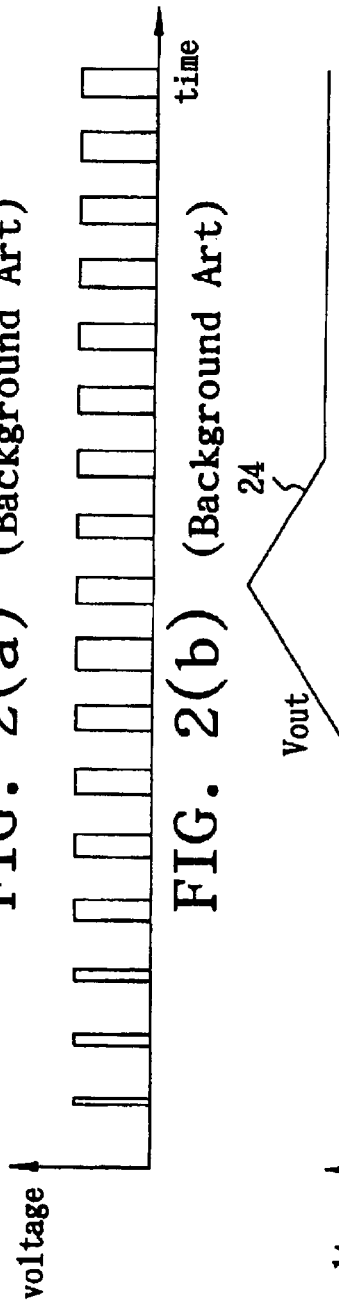
Figure 2C:
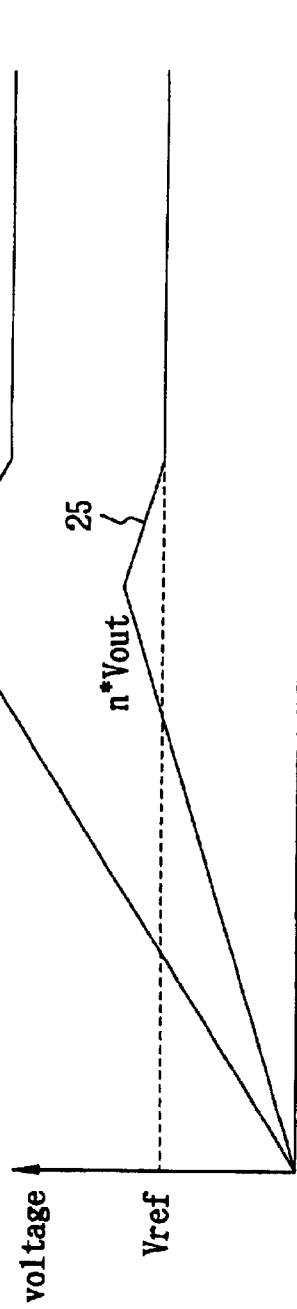
Figure 3:
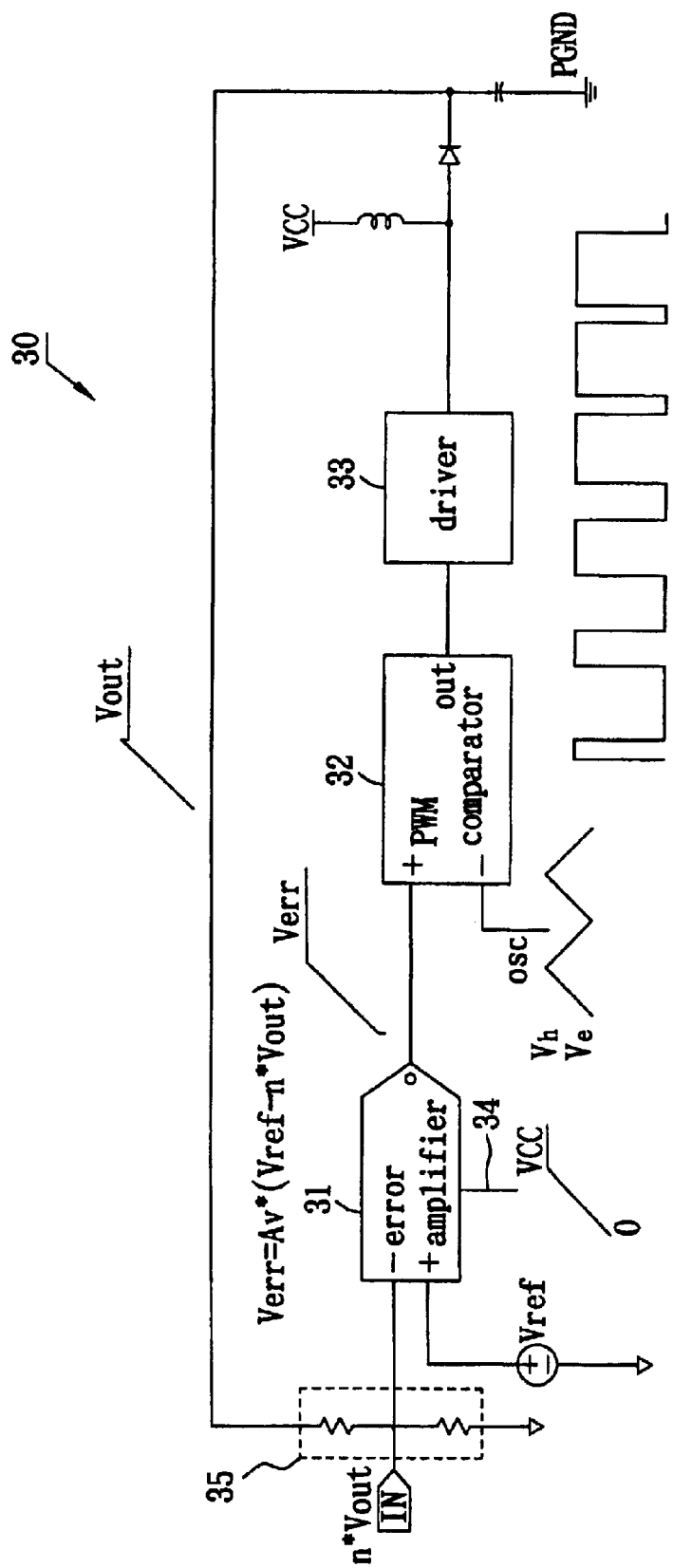
FIG. 3 illustrates a preferred embodiment of the DC-DC converter according to the present invention.

FIG. 3 shows an embodiment of the DC-DC converter of the present invention. The DC-DC converter 30 comprises an error amplifier 31, a PWM comparator 32, and a driver 33. The output end of the DC-DC converter 30 feeds back to the input end through a voltage divider 35. Hence, the voltage ratio n of the input end to the output end is in a range of 0 to 1. The most significant difference between the present invention and the conventional DC-DC converter 10 is that the DC-DC converter 30 of the present invention sets the soft start 34 in the error amplifier 31. With soft start 34 added, the output voltage of the error amplifier 31 will follow the slowly ascending soft start voltage when the DC-DC converter 30 is enabled. The soft start 34 looses control over the error amplifier 31 when soft start voltage exceeds the steady state output voltage ($V_{err}$) of the error amplifier 31, and then the input of the amplifier 31 will take over the control. By doing so, it significantly eradicates or reduces jitters caused by the output voltage of the error amplifier 31 and the DC-DC converter 30.

Figure 4:
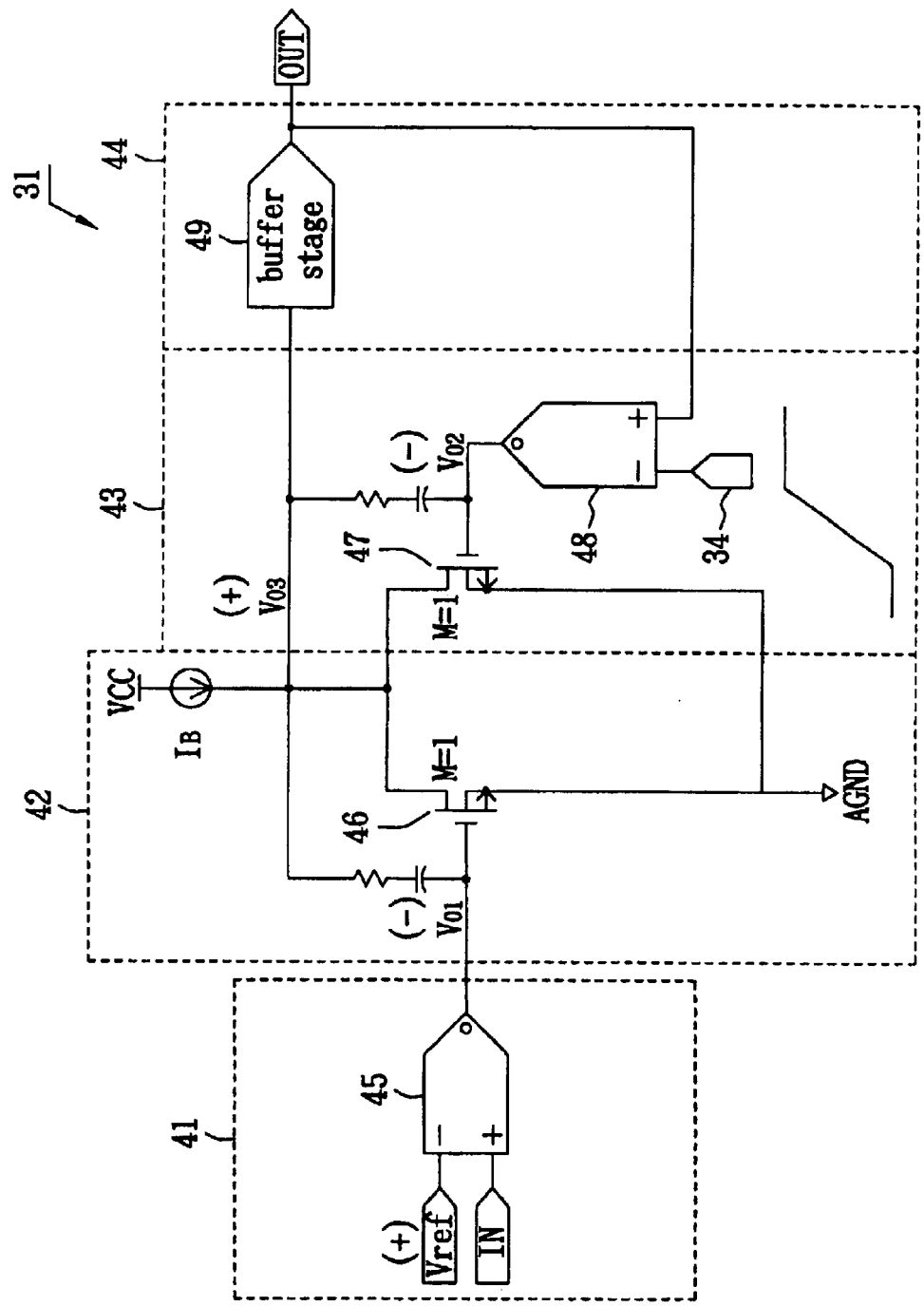
FIG. 4 illustrates a preferred embodiment of the error amplifier according to the present invention.

FIG. 4 shows an embodiment of a circuit topology inside the error amplifier of the present invention. The error amplifier 31 comprises a first amplification stage 41, a second amplification stage 42, a clamp stage 43, and a buffer stage 44. The first amplification stage 41 comprises a first amplifier 45, which is used to amplify the difference between the reference voltage ($V_{ref}$) and the input signal (IN). The clamp stage 43 comprises a second amplifier 48, which is used to amplify the difference between the soft start signal 34 and the output signal (OUT). When the input signal IN is smaller than the reference voltage $V_{ref}$, the clamp stage 43 is used to clamp the output signal OUT to the soft start signal 34. The buffer stage 44 comprises a buffer 49, which serves as a driver for the output signal (OUT). The second amplification stage 42 comprises a first transistor 46 controlled by the first amplification stage 41 and a second transistor 47 controlled by the clamp amplifier 43. The outputs of the first transistor 46 and the second transistor 47 are electrically connected to the buffer stage 44. The first amplification stage 41 and the second amplification stage 42 act as an error amplification module for amplifying the difference between the reference voltage and the input signal when the soft start signal is larger than the steady state voltage. The clamp stage and the error amplification module alternately output through a set of switching transistors including the first transistor 46 and the second transistor 47.

Figure 5:
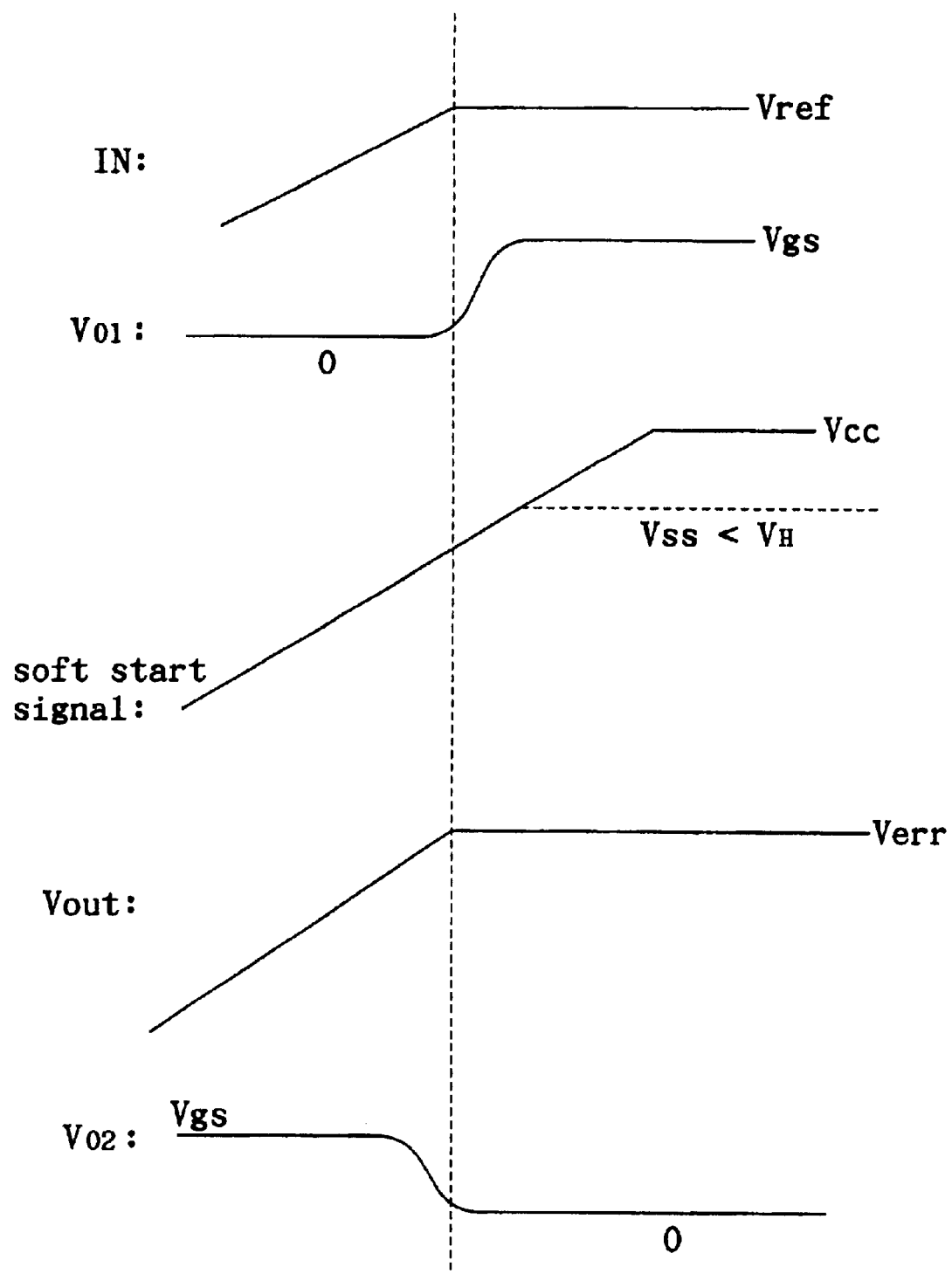
FIG. 5 illustrates a timing diagram of the error amplifier according to the present invention.

FIG. 5 shows the operational timing diagram of the error amplifier 31. During initialization, the soft start 34 ascends slowly from 0 to $V_{cc}$, which launches the second amplifier 48 and the second transistor 47. Meanwhile the first amplifier 45 has no action since $V_{IN}$ is smaller than $V_{ref}$. The output $V_{O1}$ is 0, which causes the shutdown of the first transistor 46 of the second amplifier 42. In other words, during initialization, the clamp stage 43, the second amplifier 42 and the buffer stage 44 will control the error amplifier 31, and form a control loop of which the gain is 1. The output voltage of the buffer 49 in the buffer stage 44 will follow the voltage of the soft start 34 until that of soft start 34 exceeds the steady state voltage of the error amplifier 31 ($V_{err}$).

When the voltage of the soft start 34 exceeds the steady state voltage $V_{err}$, the output $V_{O2}$ of the second amplifier 48 of the buffer stage 43 is 0, and the second transistor 47 will be shut down at the same time. Meanwhile the first amplification stage 41, the second amplification stage 42 and the buffer stage 44 will control the error amplifier 31, and stabilize the output voltage to the steady state voltage $V_{err}$.

Figure 6A:
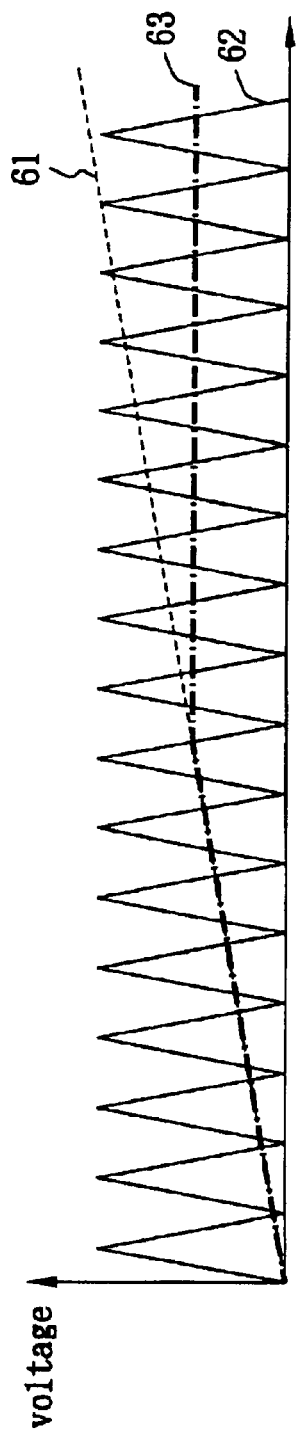
FIGS. 6(a) to (c) illustrate timing diagrams of the DC-DC converter according to the present invention.
Figure 6B:
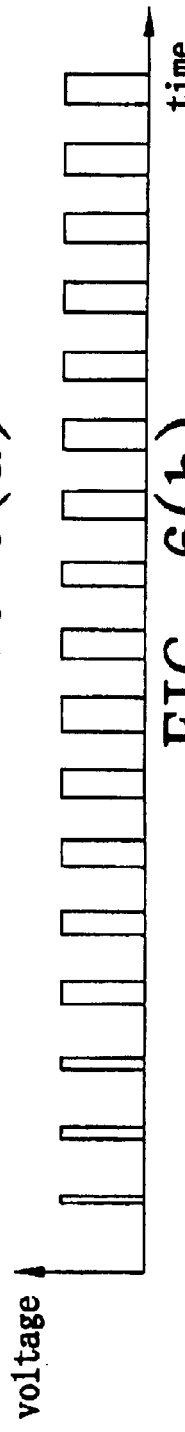
Figure 6C:
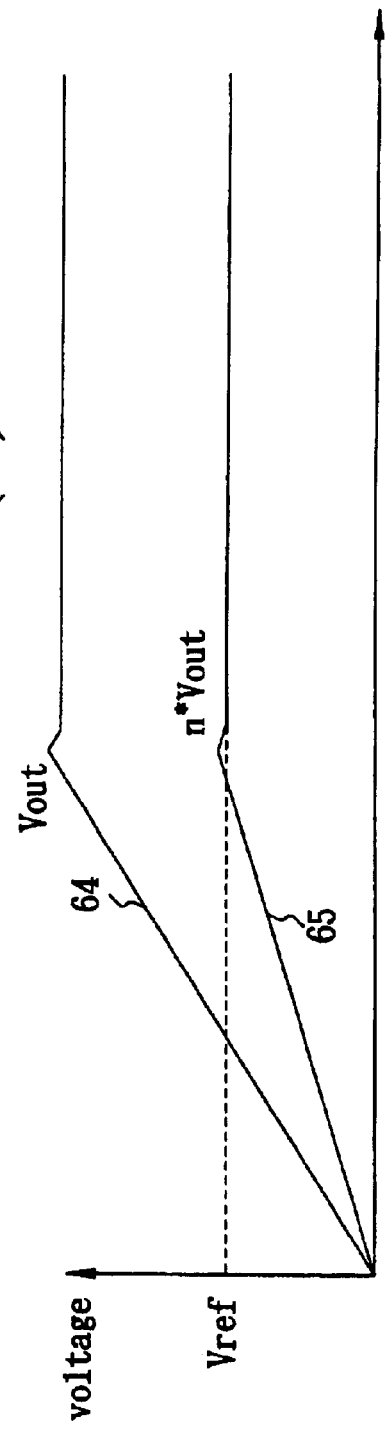

FIGS. 6 (*a*) to 6 (*c*) are the operational timing diagrams of the DC-DC converter 30 of the present invention. In FIG. 6(*a*), a curve 62 represents the input OSC of the PWM comparator 32, a curve 61 represents the slowly ascending waveform of the soft start 34, and a curve 63 represents the output of the error amplifier 31. In FIG. 6(*b*), the output pulse width of the PWM comparator 32 will show a gradual increasing tendency. In FIG. 6 (*c*), both the output curve ($V_{out}$) 64 of the DC-DC converter 30 and the input curve ($n \times V_{out}$) 65 after feedback will ascend gradually to reduce instantaneous current. Most importantly, the DC-DC converter 30 will be converged directly to steady state voltage $V_{err}$. This will affectively tackle the disadvantage of jitters in conventional technique and assure the proper operation and reliability of electronic devices.

Figure 7:
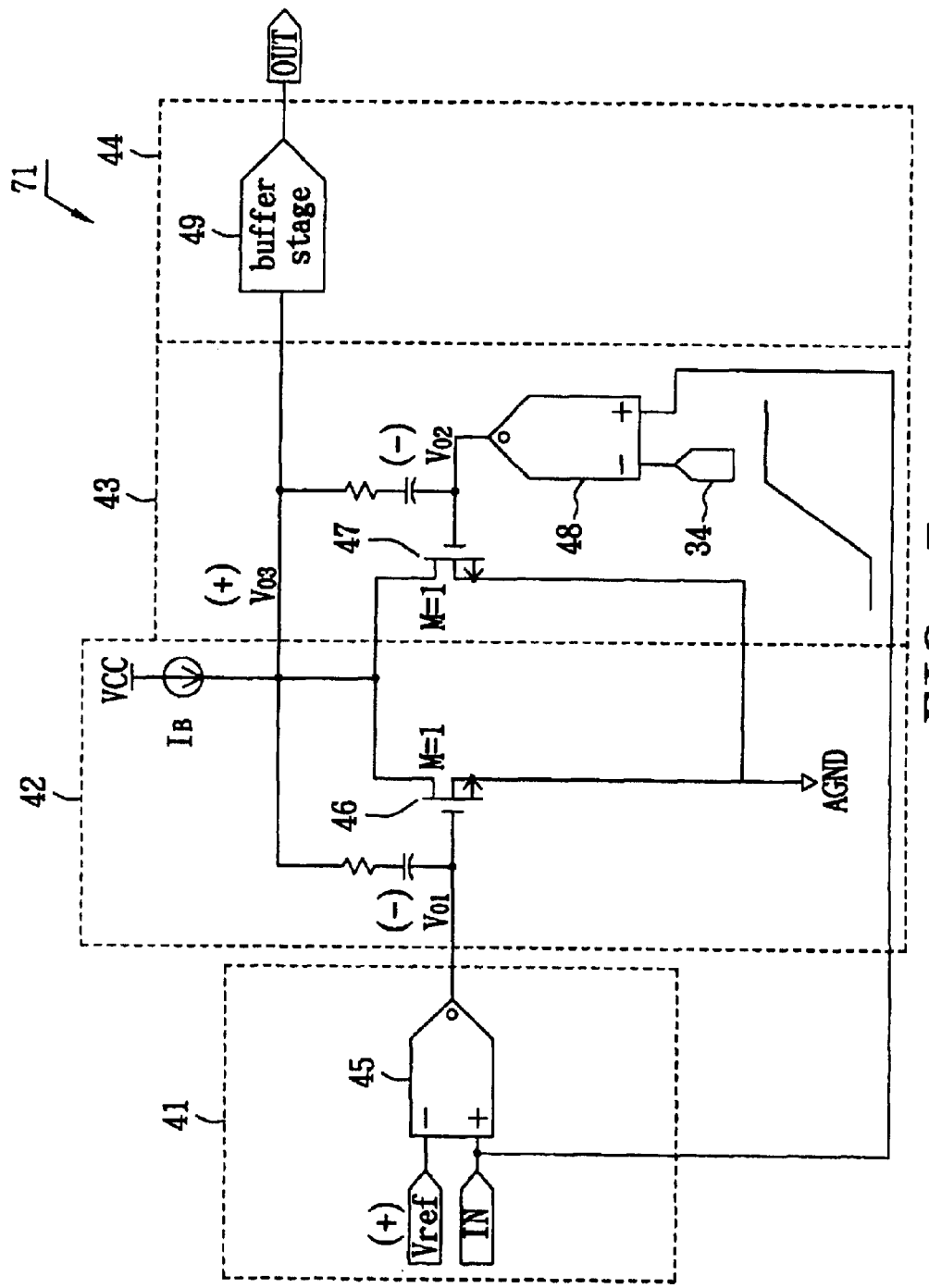
FIG. 7 illustrates another preferred embodiment of the error amplifier according to the present invention.

FIG. 7 shows another embodiment of circuit topology inside the error amplifier 71 of the present invention. Unlike the circuit topology in FIG. 4, one input of the second amplifier 48 is electrically connected to the input end IN of the error amplifier 71 instead of the output end OUT. As mentioned above, the output (OUT) voltage produces the input (IN) voltage through a voltage divider 35, so that there is a positive correlation between the two voltages.

Another feature of the present invention is that the soft start 34 can be used to control the output pulse width of the PWM comparator 32. If the maximal voltage of the soft start 34 is set as between $V_h$ and $V_1$ (the input OSC of the PWM comparator 32), the output voltage of the error amplifier 31 will follow the voltage of the soft start 34 and be clamped to the maximal voltage of the soft start 34, so that both the output pulse width and the duty cycle of the PWM comparator 32 can be controlled.

The error amplifier and the DC-DC converter of the present invention have the following advantages:

1. Built-in soft start;
2. Achieving smoothly ascending output voltage without jitters;
3. Reducing jitters in voltage conversion; and
4. Being capable of directly controlling the maximal width of the modulated pulses in the DC-DC converter.

The above-described embodiments of the present invention are intended to be illustrative only. Numerous alternative embodiments may be devised by those familiar with the technology without departing from the scope of the following claims.

What is claimed is:

1. An error amplifier, comprising:
   a soft start signal;
   an input signal;
   a reference voltage;
   an output signal converging to a steady state voltage;
   a first amplification stage for amplifying the difference between the reference voltage and the input signal;
   a clamp stage for clamping the output signal to the soft start signal when the soft start signal is smaller than the steady state voltage;
   a buffer stage for driving the output signal; and
   a second amplification stage including a first transistor controlled by the first amplification stage and a second transistor controlled by the clamp stage, wherein the outputs of the first transistor and second transistor are electrically connected to the buffer stage.

2. The error amplifier of claim 1, wherein the input signal is generated by a voltage divider.

3. The error amplifier of claim 1, wherein the clamp stage compares the input signal or output signal with the soft start signal.

4. The error amplifier of claim 1, wherein the first transistor is enabled when the soft start signal is larger than the steady state voltage, and the second transistor is enabled when the soft start signal is smaller than the steady state voltage.

* * * * *